(12) United States Patent
Vogt et al.

(10) Patent No.: US 8,080,797 B2
(45) Date of Patent: Dec. 20, 2011

(54) BOLOMETER AND METHOD OF PRODUCING A BOLOMETER

(75) Inventors: Holger Vogt, Muelheim (DE); Marco Russ, Oberhausen (DE)

(73) Assignee: Fraunhofer-Gesellschaft zur Foerderung der Angewandten Forschung e.v., Munich (DE)

( * ) Notice: Subject to any disclaimer, the term of this patent is extended or adjusted under 35 U.S.C. 154(b) by 276 days.

(21) Appl. No.: 12/440,274

(22) PCT Filed: Sep. 8, 2006

(86) PCT No.: PCT/EP2006/008790
§ 371 (c)(1),
(2), (4) Date: Mar. 6, 2009

(87) PCT Pub. No.: WO2008/028512
PCT Pub. Date: Mar. 13, 2008

(65) Prior Publication Data
US 2009/0321644 A1 Dec. 31, 2009

(51) Int. Cl.
*H01L 27/14* (2006.01)
*H01L 21/28* (2006.01)
(52) U.S. Cl. .................. 250/338.4; 250/338.3
(58) Field of Classification Search ............... 250/338.3, 250/338.4
See application file for complete search history.

(56) References Cited

U.S. PATENT DOCUMENTS

| | | | |
|---|---|---|---|
| 4,584,932 A | 4/1986 | Abma | |
| 5,021,663 A | 6/1991 | Hornbeck | |
| 5,450,053 A * | 9/1995 | Wood | 338/18 |
| 5,688,699 A | 11/1997 | Cunningham et al. | |
| 5,912,464 A | 6/1999 | Vilain et al. | |
| 6,034,374 A * | 3/2000 | Kimura et al. | 250/370.08 |
| 6,495,829 B1 * | 12/2002 | Oda | 250/339.02 |
| 6,690,014 B1 | 2/2004 | Gooch et al. | |
| 2001/0010360 A1 * | 8/2001 | Oda | 250/338.1 |
| 2005/0122269 A1 * | 6/2005 | Frazier | 343/703 |
| 2006/0054823 A1 | 3/2006 | Yon et al. | |

(Continued)

FOREIGN PATENT DOCUMENTS

CN 1749713 A 3/2006

(Continued)

OTHER PUBLICATIONS

Official Communication issued in International Patent Application No. PCT/EP2006/008790, mailed on May 22, 2007.

(Continued)

*Primary Examiner* — David Porta
*Assistant Examiner* — Shun Lee
(74) *Attorney, Agent, or Firm* — Keating & Bennett, LLP

(57) ABSTRACT

A bolometer includes a membrane, a first spacer and a second spacer, the membrane including resistive and contact layers. At a side facing a foundation, the contact layer has a first contact region at which the first spacer electrically contacts the contact layer, and a second contact region at which the second spacer electrically contacts the contact layer. In this manner, the membrane is kept at a predetermined distance to the foundation. The contact layer is laterally interrupted by a gap, so that the contact layer is subdivided at least into two parts, the first part including the first contact region, and the second part including the second contact region, and no direct connection existing within the contact layer from the first contact region to the second contact region, and the resistive layer being in contact with the first and second parts of the contact layer.

32 Claims, 10 Drawing Sheets

U.S. PATENT DOCUMENTS

2006/0094150 A1* 5/2006 Lee et al. .................. 438/57

FOREIGN PATENT DOCUMENTS

| DE | 689 23 589 T2 | 1/1996 |
| --- | --- | --- |
| EP | 0 354 369 A2 | 2/1990 |
| EP | 1 637 853 A1 | 3/2006 |
| WO | 02/08707 A1 | 1/2002 |

OTHER PUBLICATIONS

Chu et al.: "Controlled Pulse-Etching With Xenon Difluoride"; Ninth International Conference on Solid-State Sensors and Actuators, Transducers '97; Jun. 16-19, 1997, pp. 665-668.

English translation of Official Communication issued in corresponding Chinese Application 200680055785.6, mailed on May 28, 2010.
English translation of Official Communication issued in corresponding Chinese Patent Application No. 200680055785.6, mailed on Apr. 26, 2011.
Wood: "Monolithic Silicon Microbolometer Arrays"; Semiconductor Semimetals; vol. 47; 1997, pp. 43-121.
Mottin: "Above IC Amorphous Silicon Imager Devices"; Leti 2005 Annual Review; http://www-leti.cea.fr/commun/AR-2005/pdf/t7-2-Mottin.pdf; Jul. 6, 2005, pp. 1-18.
Tissot: "Uncooled Thermal Detectors for IR Applications"; Leti 5th Annual Review; http://www-leti.cea.fr/commun/AR-2003/T5-Photodectection/25-J-LTissot.pdf; 2003, 11 pages.

* cited by examiner

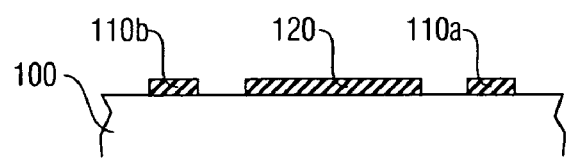
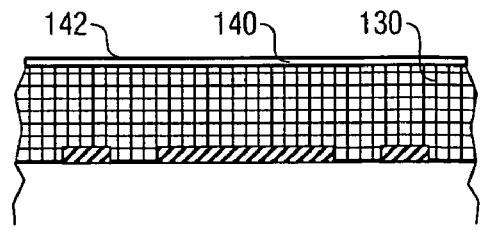
FIGURE 1A                FIGURE 1B
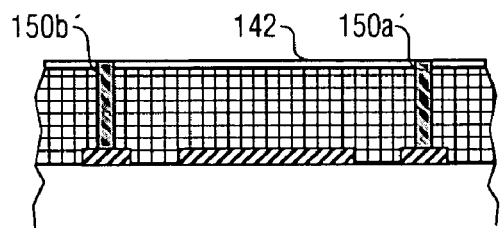
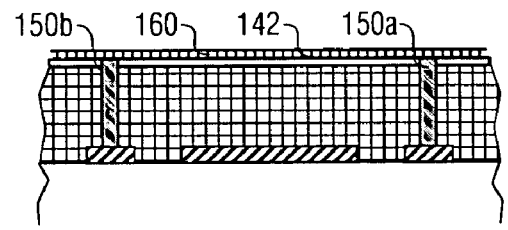
FIGURE 1C                FIGURE 1D
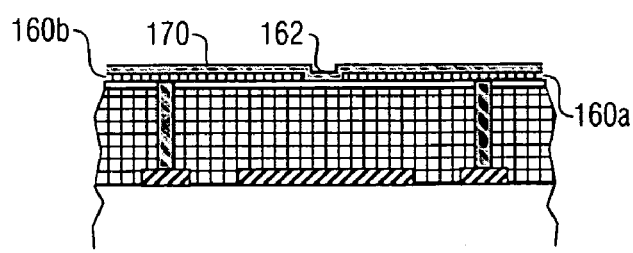
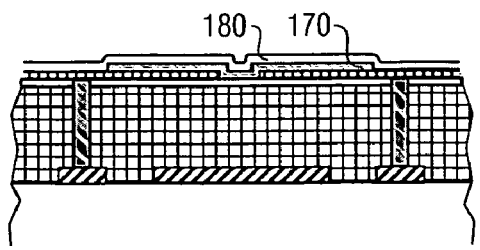
FIGURE 1E                FIGURE 1F

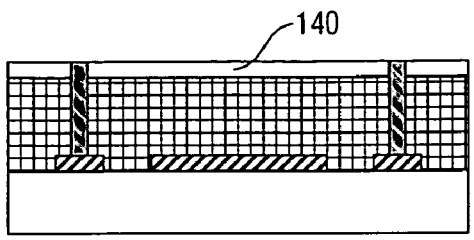
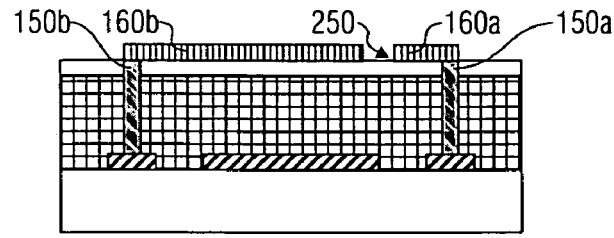
FIGURE 3A          FIGURE 3B
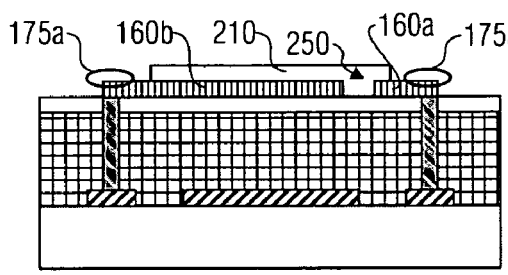
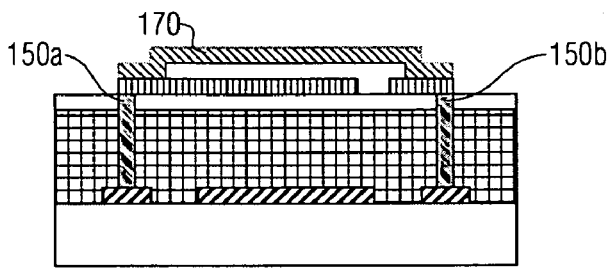
FIGURE 3C          FIGURE 3D
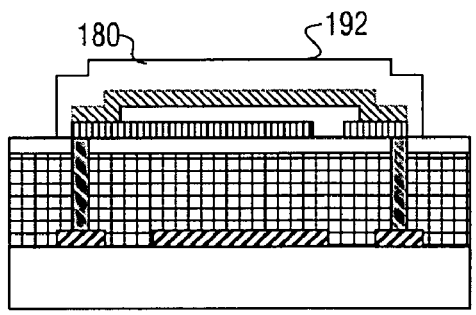
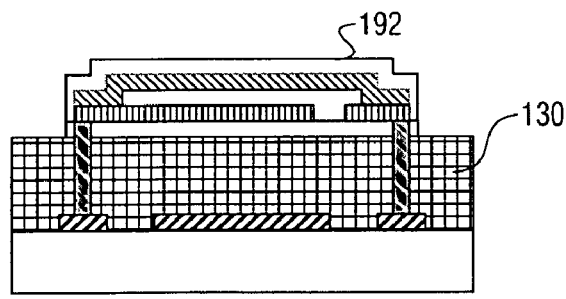
FIGURE 3E          FIGURE 3F
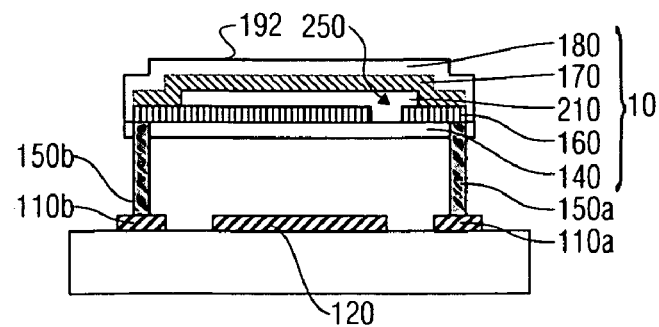
FIGURE 3G

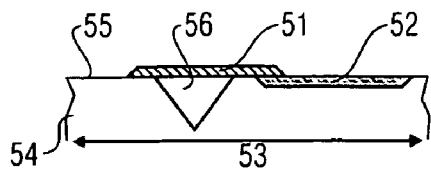
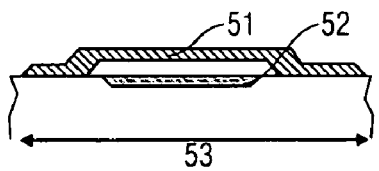
FIGURE 5A
Prior Art
FIGURE 5B
Prior Art
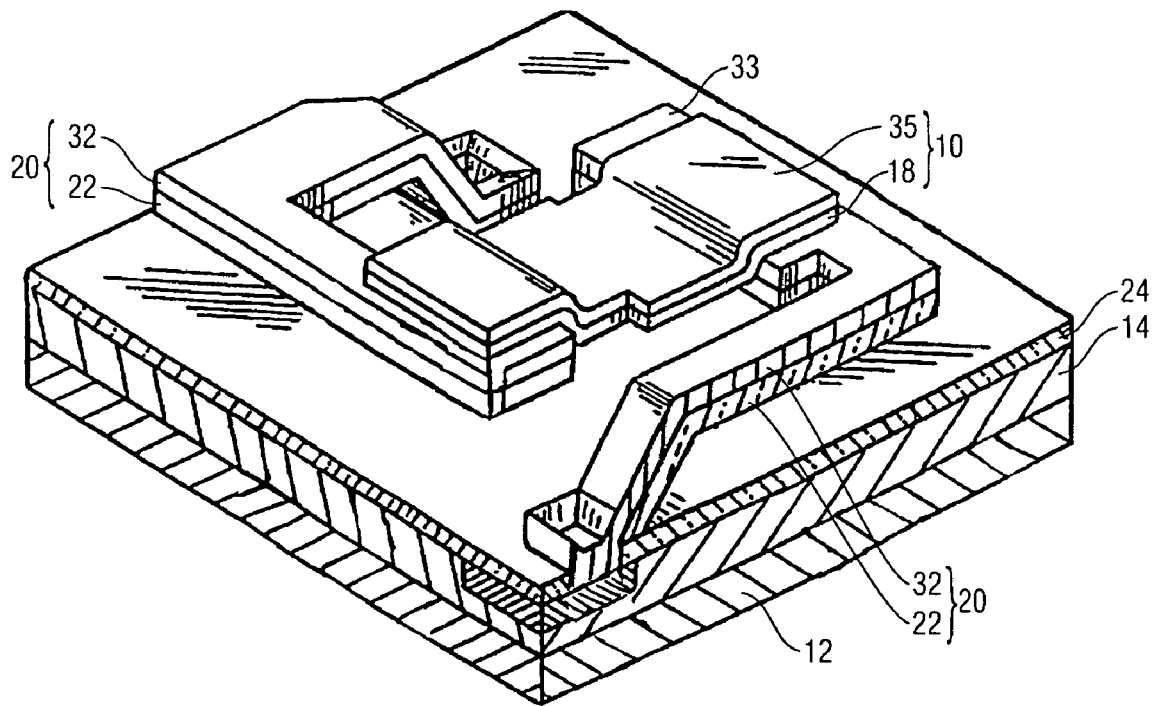
FIGURE 6
Prior Art

BOLOMETER AND METHOD OF PRODUCING A BOLOMETER

The present invention relates to a bolometer and a method of producing a bolometer, and in particular to a scalable microbolometer structure.

BACKGROUND OF THE INVENTION

A bolometer is a device for measuring the intensity of electromagnetic radiation of a specific wavelength range (approx. 3-15 µm). It comprises an absorber, which converts electromagnetic radiation to heat, and a device for measuring an increase in temperature. Depending on a thermal capacity of the material, there is a direct connection between an amount of radiation absorbed and the resulting increase in temperature. Thus, the increase in temperature may serve as a measure of an intensity of incident radiation. Of particular interest are bolometers for measuring infrared radiation, which is where most bolometers have a highest level of sensitivity.

A bolometer may be used, in technology, as an infrared sensor, an imager for a night-vision device or as a thermal imaging camera.

A bolometer serving as an infrared sensor comprises a thin layer which is arranged within the sensor in a thermally insulated manner, e.g. is suspended as a membrane. The infrared radiation is absorbed within this membrane, whose temperature increases as a result. If this membrane consists of a metallic or advantageously a semiconducting material, the electrical resistance will change depending on the increase in temperature and on the temperature coefficient of resistance of the material used. Exemplary values regarding various materials can be found in the paper R. A. Wood: "Monolithic silicon microbolometer arrays," *Semiconductor Semimetals*, vol. 47, pp. 43-121, 1997. Alternatively, the membrane is an insulator (silicon oxide or silicon nitride) onto which the resistor has been deposited as a further thin layer. In other implementations, insulating layers and an absorber layer are disposed in addition to the resistive layer.

The temperature dependence of metal layer resistances is linear, semiconductors as resistance material have an exponential dependence. A high level of dependence is also to be expected from diodes as thermal detectors with their current/voltage characteristic in accordance with $$I_D = I_0 * (\mathrm{Exp}\{eU_D/kT\} - 1)$$

wherein T is the temperature, k is the Boltzmann constant, e is the elementary electric charge, $I_D$ and $U_D$ designate a current intensity and voltage within the diode, and $I_0$ is a constant which is independent of the voltage.

Bolometers may serve as individual sensors, but may also be designed as rows or 2D arrays. Rows and arrays nowadays are typically produced using Microsystems engineering methods in surface micromechanics on a silicon substrate. Such arrays are referred to as microbolometer arrays.

An advantageous wavelength of the infrared radiation to be detected is about 8-14 µm, since this wavelength range comprises radiation of matter which has approximately room temperature (300 K). The wavelength range of 3-5 µm is also of interest because of a permeable atmospheric window.

An essential advantage of thermal bolometers over other (photonic) IR detectors (IR=infrared) is that they may be operated at room temperature, i.e. uncooled.

The aim of further development is to arrange as many bolometer cells (pixels) as possible within one array. Thus, the array will have a higher number of pixels and will provide a better resolution of an image at the same total area (chip area) of the array. For example, an arrangement of 160×120 pixels is customary, 320×240 is also available, 640×480 pixels (VGA resolution) has been announced and will be available shortly, but only at considerable additional cost. At the same time it is useful to minimize the cost of the array so as to open up new markets, e.g. the field of motor vehicles.

The usual dimensions of a single pixel within the array comprise a pixel area of 35 ×35 µm² to 50 ×50 µm². With 320 ×240 pixels, a chip area thus is at least 12.2 ×8.4 mm² =94 mm² (pixel area alone) plus an area for a readout circuit (e.g. an additional 2 mm per edge), in total approx. 137 mm². Since a yield (the number of good chips in relation to the total number on a disk, or wafer) sharply decreases as the chip area increases, economic production of such an array is hardly possible. Therefore, an increase in the number of pixels should entail a reduction of the pixel area. IR imagers of 35 ×35 µm² have been commercially available for some time now. As is described in the paper Mottin; "Above IC Amorphous Silicon Imager Devices;" Leti 2005 Annual Review; Jul. 6, 2005, pp. 1-18, arrays of 25×25 µm² are currently being developed. But even this surface area, which has already been scaled, leads to an unacceptably large chip area (estimated to be approx. 250 mm²) with imagers exhibiting VGA resolution. Further scaling of the pixel area is therefore absolutely essential. What is aimed at are pixels having pixel areas of approx. 15×15 µm². Further reduction in size will then conflict with the fact that the optical systems which would be employed in such a case would have to be of very high quality, which, in turn, would only be feasible at very high cost.

Detection of infrared radiation within a microbolometer is based on the fact that the radiation heats a resistor which is thermally well insulated. Said resistor is temperature-dependent, and therefore it changes its resistance as a function of warm-up. A change in resistance is read out via an ROIC (read out integrated circuit). Typical increases in temperature occurring at the resistor are within the range of several millikelvin (mK) per degree of temperature change in a target observed. For this increase in temperature at the bolometer to become possible, the resistor must be very well insulated thermally. This is achieved by arranging the resistor on a membrane (or by configuring it as a membrane itself) which is arranged, at a distance of several µm, above a disk surface and is connected to the disk surface, or to a substrate, only at few points having low thermal conductivity.

FIG. 5 shows two bolometers in accordance with the prior art which are described in R. A. Wood: "Monolithic silicon microbolometer arrays," Semiconductor Semimetals, vol. 47, pp. 43-121, 1997. FIG. 5*a* depicts a single-level pixel which comprises a sensor 51, electronics 52 located on a substrate 54, and which has a pixel size 53. FIG. 5*b* shows a two-level pixel, wherein the electronics 52 are arranged below the sensor 51. This bolometer also corresponds to the prior art, and by comparison with the bolometer shown in FIG. 5*a* it comprises a higher fill factor (ratio of IR-sensitive area to the total area).

The membrane is generated, for example, in that the resistor or sensor 51 is produced on a disk surface 55, and in that subsequently, the region is undercut, so that a cavity 56 results. By locally removing silicon (Si), for example, the thermal resistance between the resistor on the membrane 51 and the substrate 54 will increase. A readout circuit 52 is integrated next to the membrane 51, and therefore takes up additional chip area. Therefore, a structure of FIG. 5*b*, wherein the resistor 51 is disposed in a second plane on a membrane above the readout circuit 52, is more advantageous.

For measuring the resistance, two contact points are necessary. They may be formed by arranging feed lines on portions of the membrane which incline in the upward direction. The inclinations at the same time serve as spacers for the membrane. FIG. 6 shows a perspective view of a corresponding structure comprising a membrane 10, which consists of a support 35 and a resistive layer 18. Such an arrangement is described in FIG. 2 of U.S. patent U.S. Pat. No. 5,688,699 (Nov. 2, 1997; B. T. Cunningham, B. I. Patel: "Microbolometer"). The membrane 10 is supported by inclined support arms 20 comprising an electrically conducting layer 32 and a thermally insulating layer 22. A contact of the membrane 10 via the support arms 20 comprises an overlap 33, and the support arms 20 extend into an epitaxial layer 14, where the corresponding circuit (not shown in the figure) is located. The epitaxial layer 14 is positioned between a substrate 12 and an insulating layer 24.

If the membrane 10 is planar (has no inclinations), the signals are supplied via metallic plugs which at the same time serve as spacers. This structure is described in Tissot: "Uncooled Thermal Detectors for IR Applications;" Leti $5^{th}$ Annual Review; 2003, 11 pages and FIG. 7 shows a perspective view of such a conventional structure having a membrane 10 on two contact plugs 26a and 26b, which is held at a distance 72 above a foundation 73. The membrane 10 having a size 75 comprises a thickness 74, and the foundation 73 comprises a reflector. Thermal insulation from the foundation 73 is established via the bridges 76a,b. The foundation 73 has an ROIC input pad 77 located thereon by means of which the bolometer is contacted. Contacting of the membrane 10 comprises an overlap 78 as compared to a diameter of the contact plugs 26a and 26b. This overlap 78 reduces the fill factor.

Optimum absorption of the IR radiation is achieved in that the membrane 10 comprises a layer resistance in accordance with a spreading resistance of an electromagnetic wave in air (377Ω/□), and is arranged at a height of λ/4 (approx. 2.5 μm at the advantageous wavelength λ of, e.g., 8-14 μm) above a reflector 73.

US patent U.S. Pat. No. 5,912,464 cites such a bolometer and a production method, and FIG. 8 shows a portion of it. FIG. 8a shows a cross section through a contacting of the membrane 10, the cross-sectional plane being shown by a dash-dotted line in FIG. 8b with a viewing direction 81.

The contact plug 26b contacts a terminal pad 77, and, at the same time, a contact layer 23. Further layers of the bolometers are a reflection layer 21, a sacrificial layer 22, the bolometer or resistive layer 27, and transition layers 24 and 25. The electrical contacting of the resistive layer 27 is established via the contact layer 23, and the transition layers 24 and 25 serve for improved contacting of the contact layer 23. The contact layer 23 extends in a meandering manner along the resistive layer 27 from a contact plug 26a to the contact plug 26b. The meandering implementation of the electrode layer 23 is shown by a dashed line in FIG. 8b. The meandering implementation of the electrode layer 23 serves to improve the absorption of the infrared radiation.

It is also in this bolometer in accordance with the prior art that the contact plug 26b and the membrane 10 comprise an overlap. In FIG. 8a, the overlap of the contact plug 26b is marked by x, and the overlap of the membrane 10 is marked by y. The sacrificial layer 22 is only present in the intermediate step shown here, and will be removed later on.

With corresponding processing, a sacrificial layer 22 of polyimide is applied as a spacer to a disk having an integrated circuit (e.g. in CMOS technology; not depicted in the figure). In the region of the contact plugs 26a,b, the sacrificial layer 22 is opened in the form of a contact hole. In one implementation, which is shown in FIG. 8a, a metallic contact layer 25 is deposited and patterned, and subsequently a contact metal for the contact plugs 26a,b is deposited. This metal is etched such that it will overlap an edge of the contact hole. The resistive layer 27 is deposited and patterned. At last, the sacrificial layer 22 underneath the membrane 10 is removed, so that said membrane, which is held by the contact plugs 26a,b, is suspended above the reflection layer 21, and, thus, a λ/4 absorber is formed.

FIG. 9 shows a conventional contacting as is also used in the example of FIG. 8. The contact plug 26b comprises an overlap x over a diameter z of the contact plug 26b, and the membrane 10 comprises an overlap by a value of y over the contact plug 26b.

All embodiments described in U.S. patent U.S. Pat. No. 5,912,464, but also the structures in accordance with U.S. patent U.S. Pat. No. 5,688,699 or of document Tissot: "Uncooled Thermal Detectors for IR Applications;" Leti $5^{th}$ Annual Review; 2003, 11 pages have in common that the contact metal projects beyond the diameter z of the contact plug 26b (distance x in FIG. 9). The membrane 10 itself projects even further beyond (distance y in FIG. 9). The overlaps x and y represent a compensation for adjustment tolerances, they make sure that the region of the contact plug (the contact area in FIG. 7) is not etched.

FIG. 10 shows how the bolometers in accordance with the prior art scale when the pixel size 75 is reduced. FIG. 10a shows a top view of the membrane 10 with conventional contacting by means of the contact plugs 26a and 26b, the membrane 10 being connected to the contact plugs 26a,b via the bridges 76a,b. The bridges 76a,b act as thermal insulation. As is explained in FIG. 9, the membrane 10 overlaps the contact plug 26b by the value of y, and the contact plug 26b overlaps the diameter z of the contact plug 26b by the value of x. In case of a reduction (scaling) of the pixel size 75, as is shown in FIG. 10b, the size of the contact plugs is not scaled for technological reasons, and the fill factor decreases accordingly. A reason for this is that the conventional manufacturing process is based on photosensitive polyimide as the sacrificial layer 22, and is therefore limited to a minimum hole size which must be larger than approx. 3 μm (please see further comments below).

FIG. 10a also shows that, as is also visible in FIG. 7, the contact plugs 26a,b with their contact to the membrane 10 are indeed relatively large, but that with a pixel of an edge length of approx. 50 μm, the surface percentage thereof is relatively small. However, it may already be seen from FIG. 6 that the actual membrane area 35 only makes up for a relatively small proportion of the total area of the pixel, and that in this implementation, the fill factor is below 50%.

As may be seen in FIG. 6, FIG. 8b or FIG. 10a, the contact plug 26b is connected to the membrane 10 via a thin arm 20, or 76b. In addition to providing mechanical support and electrical supply, the arm 20, or 76b, also serves to thermally insulate the membrane 10 from the contact plug 26b. Its long length and its small cross-sectional area ensure a high thermal resistance between the membrane 10 and the substrate.

As was already described, it is desirable to make the pixels as small as possible. A direct comparison of FIGS. 10a and 10b shows that no satisfactory solution may be found for this issue with pixels of conventional technology. With the scaled pixel in FIG. 10b, the contact plugs 26a,b take up a disproportionately large share in the total pixel area. This is due to the fact that the metal of the plug projects beyond its opening through the membrane 10 by x, additionally, the membrane 10 is typically larger than the overlap x by a factor of y. With a predefined total area, the proportion of an active area on the membrane 10 becomes smaller, the fill factor decreases, and a sensitivity of the pixels to the IR radiation also decreases as a consequence.

SUMMARY

According to an embodiment, a bolometer may have: a membrane including a first ridge and a second ridge for thermal insulation; a first spacer; a second spacer, the membrane including a resistive layer and a contact layer, the contact layer including, at a side facing a foundation, a first contact region at which the first spacer electrically contacts the contact layer, and a second contact region at which the second spacer electrically contacts the contact layer, and the first and second spacers keeping the membrane at a predetermined distance from the foundation, and the first ridge being connected to the first spacer, and the second ridge being connected to the second spacer, and the contact layer being laterally interrupted by a gap, so that the contact layer is subdivided at least into two parts, the first part of which includes the first contact region, and the second part of which includes the second contact region, and no direct connection existing within the contact layer from the first contact region to the second contact region, and the resistive layer being in contact with the first part of the contact layer and to the second part of the contact layer.

According to another embodiment, a method of producing a bolometer may have the steps of: a) providing a substrate; b) depositing a sacrificial layer onto the substrate; c) forming a first through opening and a second through opening; d) forming first and second spacers in the first and second through the openings; e) applying a contact layer such that the contact layer includes, at a side facing the substrate, a first contact region at which same is contacted by the first spacer, and a second contact region at which same is contacted by the second spacer; f) patterning the contact layer so as to form a gap within same, so that the contact layer is subdivided into two parts, the first part of which includes the first contact region, and the second part of which includes the second contact region, and no direct connection existing within the contact layer from the first contact region to the second contact region; g) applying a resistive layer such that the resistive layer is in contact with the first part of the contact layer and with the second part of the contact layer, the resistive layer and the contact layer forming a membrane of the bolometer; h) patterning an outline of the membrane; and i) patterning the membrane in order to form within same a first ridge and a second ridge for thermal insulation, the first ridge being in contact with the first spacer, and the second ridge being in contact with the second spacer; j) removing the sacrificial layer.

According to another embodiment, a method of producing a bolometer may have the steps of: a) providing a substrate; b) depositing a sacrificial layer onto the substrate; c) forming a first through opening and a second through opening; d) forming a first spacer within the first through opening and a second spacer within the second through opening; e) laterally applying a resistive layer such that the resistive layer is not in contact with the conductive material within the first and second through the openings; f) applying an insulating layer on a side of the resistive layer which faces away from the substrate, so that the insulating layer leaves the resistive layer open at a first contact point and at a second contact point; g) applying a contact layer such that the contact layer includes, at a side facing the substrate, a first contact region at which same is contacted by the first spacer, and a second contact region at which same is contacted by the second spacer, and such that the contact layer is in contact with the first contact point and with the second contact point of the resistive layer; h) patterning an outline of the membrane; i) patterning the membrane in order to form within same a first ridge and a second ridge for thermal insulation, the first ridge being in contact with the first spacer, and the second ridge being in contact with the second spacer; j) patterning the contact layer in order to form at least one gap within same, so that the contact layer is subdivided into at least two parts, the first part of which includes the first contact region and the first contact point of the resistive layer, and the second part of which includes the second contact region and the second contact point of the resistive layer, and no direct connection existing within the contact layer from the first contact region to the second contact region; k) removing the sacrificial layer.

The present invention is based on the finding that while using process steps which are customary, for example, in CMOS technology, a pixel structure may be produced which enables noticeable scaling.

Fundamental characteristics of an approach may be summarized, by way of example, as follows.

For example a CMOS wafer, which in the region of membrane 10 of the bolometer comprises a reflector, e.g. in the form of an Al layer, may serve as a starting substrate. In the region of the contact plugs or spacers, one terminal pad (made of Al, for example) is connected to one readout circuit, respectively. This substrate has a sacrificial layer deposited thereon, for example an amorphous silicon layer (a-Si layer) of a thickness of approx. 2.5 µm. This may be performed, for example, in a CVD process (CVD=chemical vapor deposition), possibly assisted by plasma.

Subsequently, a first protective layer is deposited (e.g. a thin layer of silicon oxide is deposited by a CVD process; approx. 50-200 nm), so that a layer sequence of a first protective layer/sacrificial layer results. Possibly, a stress-compensated layer of, e.g., oxide and nitride is deposited instead. The layer sequence is now opened in the region of the spacers. This may be performed, for example, by an etching process, which comprises exposing, by means of photo technique, a small contact opening (of e.g. approx. $0.5 \times 0.5$ µm$^2$ to $1.5 \times 1.5$ µm$^2$) in a resist mask. Thereafter, the layer sequence with the resist mask is etched anisotropically, i.e. perpendicularly, so that a hole extends as far down as the terminal pad (metal terminal of the readout circuit). Possibly the sacrificial layer underneath the first protective layer may be slightly undercut, so that the first protective layer overhangs slightly. A thin intermediate layer, for example of Ti/TiN (e.g. 20 nm/80 nm), is sputtered, so that a bottom and a wall of holes are at least partially covered. A conductive material is deposited thereon (for example tungsten by a CVD process) until the hole is completely filled up to a surface. For example by a CMP method (CMP=chemical mechanical polishing), the conductive material is polished off the surface (including the intermediate layer). The hole remains filled up with the conductive material in the process. The first protective layer is only slightly polished, but not fully removed.

The result is a fundamental structure on the basis of which two different ways of continuing the process are possible.
Process Sequence A A contact layer, e.g. a thin Ti/TiN layer, is deposited onto the fundamental structure and is patterned. A temperature-sensitive resistive layer (consisting of a-Si, possibly of vanadium oxide (Vo$_x$) or an organic semiconductor) is deposited thereon. The actual measuring resistor of the bolometer is formed by the resistive layer above a small interstice (gap) in the contact layer. To obtain as good a thermal insulation as possible of the measuring resistor from the spacers and, therefore, from the foundation, in this kind of processing, the gap is advantageously arranged as centrally between the spacers as possible.

By implementing the contact layer accordingly, for example by suitably selecting the layer thickness and/or the layer material, the membrane comprises a layer resistance of 377Ω/□ and is therefore suitable as a λ/4 absorber, independently of the actually higher resistance of the resistive layer.

The resistive layer is now also patterned (for example using lithography and an etching step). Next, a second protective layer (covering layer, for example consisting of oxide, possibly of an organic material) is deposited and patterned, so that all of the layers above the sacrificial layer are removed between the membranes, for example in a bolometer array, and between the support arms and the associated membrane. The resistive layer remains protected all around by the second protective layer and/or an organic covering layer.

At this point, the sacrificial layer is completely removed through the resulting openings. An etching process, for example using $XeF_2$, which is described in Chu, P. B.; J. T. Chen; R. Yeh; G. Lin; J. C. P. Huang; B. A. Warneke; K. S. J. Pister "Controlled PulseEtching with Xenon Difluoride"; 1997 International Conference on Solid State Sensors and Actuators-TRANSDUCERS '97, Chicago, USA, June 16-19, p. 665-668, and which removes only the sacrificial layer at a high rate in an isotropic, i.e. non-directional manner, but with a high level of selectivity with regard to, e.g., oxide and organic materials, is particularly suitable for this purpose. This is effective, in particular, when the sacrificial layer comprises amorphous silicon. Consequently, the membrane is bared, and is supported and contacted only by the spacers. The resistive layer, which is protected on all sides, is not etched in this exemplary process. The membrane is supported on the spacers. The material of the spacers does not project beyond the resistive layer.

This approach uses only a small number of process steps for realizing a bolometer structure. In the following, alternative processing will be described which exhibits the additional advantage of as large a surface area of the active resistive layer as possible.

Process Sequence B

Starting from the same fundamental structure as prior to the process sequence A, a thin resistive layer (e.g. of amorphous silicon, $VO_x$, organic semiconductor) and an insulating layer (for example of oxide) are deposited. Subsequently, these two layers are patterned, so that the spacers which consisted of tungsten, for example, are bared. In order to adapt the layer resistance of the membrane, a contact layer (for example a thin layer of TiN, 3-15 nm) is applied, possibly followed by a second protective layer, which may comprise an oxide, for example. For thermally insulating the membrane, connections to the spacers are now reduced to two narrow ridges. This may be performed, for example, by a sequence of etching steps. When implementing the ridges, care has to be taken to ensure, on the one hand, that said implementation enables a high fill factor, and on the other hand, that the membrane is supported in a mechanically stable manner.

At this point in time, the contact layer contacts both spacers with a low resistance in parallel with the actual resistive layer. The contact layer is therefore interrupted, in two small regions (ridges), such that parallel current conduction through the contact layer is prevented. This may be performed, for example, in a further etching step.

The entire structure is then passivated by a thin protective layer (for example by an oxide layer) so as to protect the resistive layer. Finally, the sacrificial layer is removed, and thus, the membrane is bared. In this process sequence, too, an isotropic etching process using $XeF_2$ may be used, for example.

Alternatively, the sacrificial layer may be removed already prior to defining the ridges and to insulating the contact layer. In this case, the resistive layer is protected on all sides, even without any additional passivation, from an attack of the etching process comprising $XeF_2$ which is used by way of example.

Essential advantages of an inventive processing therefore include the facts that the spacers may be scaled to have clearly smaller dimensions and still exhibit sufficient adhesion to the membrane 10. Therefore, no openings in the membrane 10 and overlaps x and y are necessary as was the case with plugs 26a,b; see FIG. 9.

In other words, the spacers adjoin, or end at, the bottom of the contact layer without pushing through the contact layer.

In addition, the inventive processing enables production of bolometers or bolometer arrays with clearly smaller pixel sizes at lower cost.

BRIEF DESCRIPTION OF THE DRAWINGS

Embodiments of the present invention will be detailed subsequently referring to the appended drawings, in which:

FIGS. 1a-i show steps of producing a bolometer in accordance with process sequence A of the present invention, and top views of the bolometer;

FIGS. 3a-g show steps of producing a bolometer using a changed process order;

FIGS. 5a-b show cross-sectional views of conventional microbolometer structures;

FIG. 6 shows a perspective view of a conventional structure comprising a membrane;

FIG. 8b shows a top view of the conventional structure of FIG. 8a;

DETAILED DESCRIPTION OF THE INVENTION

Figure 1G:
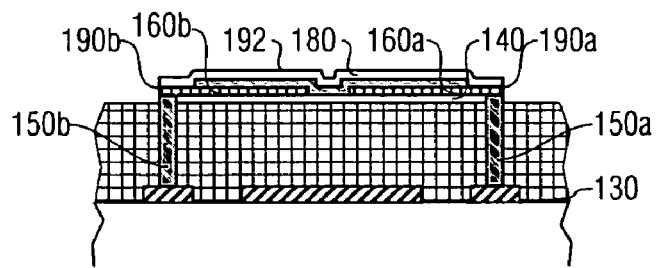

Before the present invention will be explained below in more detail with reference to the drawings, it shall be noted that identical elements in the figures are given identical or similar reference numerals, and that repeated descriptions of these elements shall be omitted.

FIGS. 1a-h show cross-sectional views of a sequence of steps for a first embodiment of the present invention, and FIG.

1*i* shows a corresponding top view with a marked sectional plane 199 of the cross-sectional views.

FIG. 1*a* shows a cross section of a substrate 100 (e.g. CMOS wafer) which has a terminal pad 110*a* and a terminal pad 110*b* deposited thereon, and, additionally, a reflector 120 applied to it. A connection of the terminal pad 110*a* and of the terminal pad 110*b* to an underlying CMOS circuit is not shown. Both terminal pads 110*a*, 110*b* serve the purpose of subsequent contacting of the bolometer.

In a subsequent step, a sacrificial layer 130 and a first protective layer 140, as shown in FIG. 1*b*, are deposited onto the structure shown in FIG. 1*a*. The sacrificial layer 130 is removed again in a later step, and it comprises a layer thickness, so that the bolometer represents a λ/4 absorber. In an advantageous embodiment, the sacrificial layer 130 comprises amorphous silicon, and the first protective layer 140 comprises an oxide.

As is shown in FIG. 1*c*, through openings 150*a*' and 150*b*' through the protective layer 140 and through the sacrificial layer 130 are produced in a next step. The through opening 150*a*' is positioned such that it ends on the terminal pad 110*a*, and the through opening 150*b*' is positioned, by analogy therewith, such that it ends on the terminal pad 110*b*. In a next step, the through opening 150*a*' and the through opening 150*b*' are filled up with a conductive material, and any material which juts out is removed, so that a planar surface 142 results.

As is shown in FIG. 1*d*, a contact layer 160 is deposited onto the surface 142 in a subsequent step. In a next step, which is shown in FIG. 1*e*, the contact layer 160 is patterned, and a resistive layer 170 is deposited. As a result, the patterned contact layer 160 comprises a gap 162 which separates a first part 160*a* from a second part 160*b* of the contact layer 160. To achieve as good a thermal insulation of the gap 162 from the spacers 150*a* and 150*b* as possible, the minimum distance from the first spacer 150*a* to the gap 162 should be identical, as far as possible, to a minimum distance from the second spacer 150*b* to the gap 162.

Advantageously, the gap 162 has such a width that the measuring resistor of the bolometer ranges from, e.g., 0.1 kΩ to 1 GΩ, and advantageously from 1 kΩ to 100 MΩ.

The resistive layer 170 is subsequently patterned, and a second protective layer 180 is applied. This is shown in FIG. 1*f*. As is shown in FIG. 1*g*, the surface of the bolometer is patterned in a subsequent step, so that the second protective layer 180 and the contact layer 160 end essentially flush with the spacers 150*a* and 150*b*. This patterned resistive layer 170 extends to an inner region of a membrane surface 192 which will form later on, so that the patterned resistive layer 170 has no contact to edge regions 190*a* and 190*b*. In this step, the first protective layer 140 is also patterned, so that the first protective layer 140 is located between the contact layer 160 and the sacrificial layer 130.

Figure 1H:
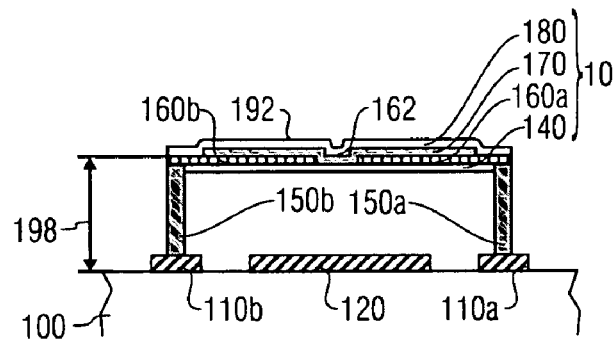

In a last step, which is shown in FIG. 1*h*, the sacrificial layer 130 is removed. The resulting bolometer comprises a membrane 10 which has a layer sequence comprising the first protective layer 140, the contact layer 160 with the first part 160*a* and the second part 160*b*, the resistive layer 170, and the second protective layer 180. The bolometer comprises a surface 192 which ends essentially flush with the spacers 150*a* and 150*b*. The spacers 150*a* and 150*b* have a height 198 selected such that the membrane 10 is kept at a distance 198, and that the distance 198 ideally corresponds to a quarter of the wavelength to be detected.

Figure 1I:
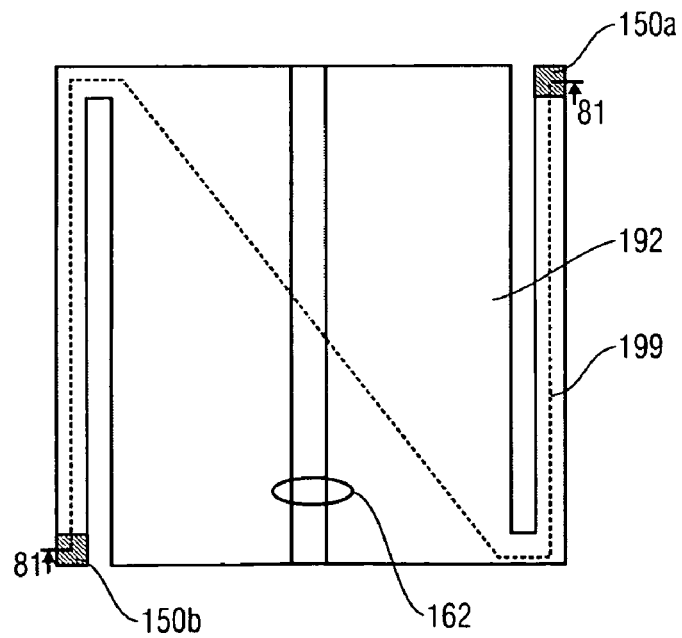

FIG. 1*i* shows a top view of the surface 192 of the bolometer with contact areas at which the spacers 150*a* and 150*b* contact the membrane 10. A dashed line 199 marks the cross-sectional plane, which passes the gap 162 and is depicted in a viewing direction 81 in FIGS. 1*a* to 1*h*.

Figure 2A:
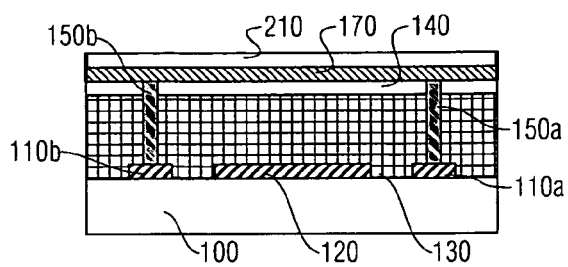
FIGS. 2a-j show steps of producing a bolometer in accordance with process sequence B of the present invention, and top views of the bolometer.
Figure 2B:
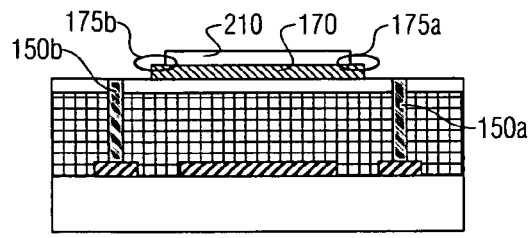
Figure 2C:
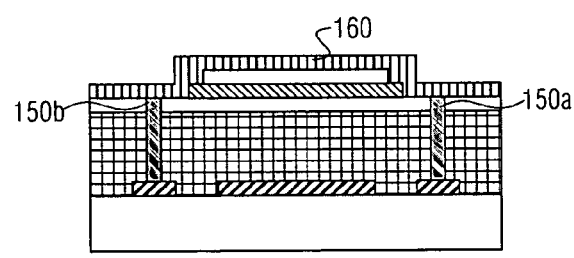
Figure 2D:
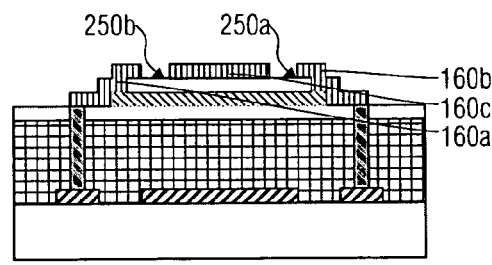
Figure 2E:
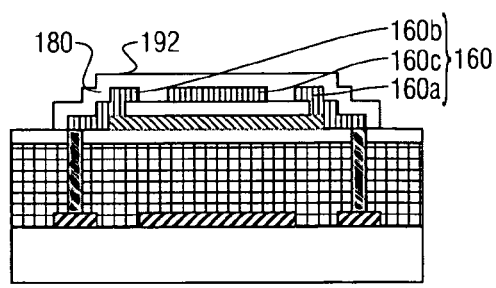
Figure 2F:
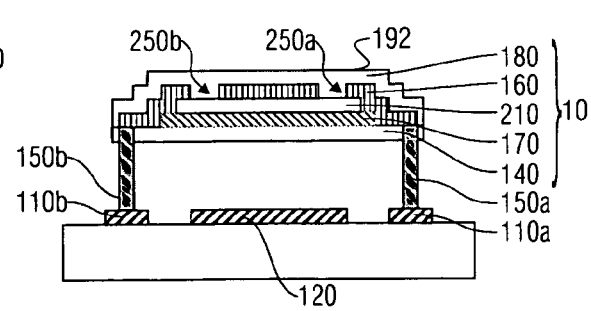
Figure 2G:
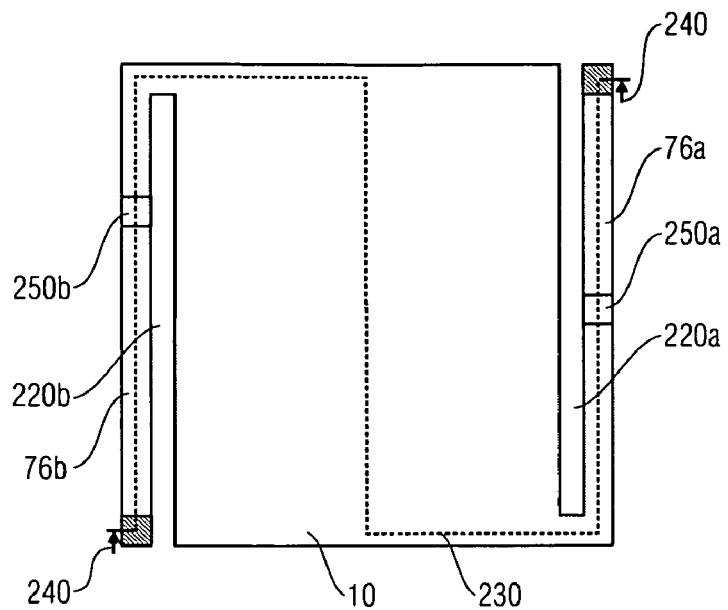

FIGS. 2*a* to 2*g* show a second embodiment of the present invention. FIGS. 2*a* to 2*f* show cross-sectional views with regard to a sequence of steps of producing a bolometer, and FIG. 2*g* shows a corresponding top view with a marked sectional plane 230 of the cross-sectional views. The first steps of the second embodiment correspond to a sequence of steps described in FIGS. 1*a* to 1*c*. Therefore, explanations on the individual steps will be omitted at this point.

The structure shown in FIG. 1*c* initially has a resistive layer 170 and an insulating layer 210 applied thereon, so that the structure shown in FIG. 2*a* is obtained. FIG. 2*a* further shows the substrate 100, the first terminal pad 110*a* with the first spacer 150*a*, the second terminal pad 110*b* with the second spacer 150*b*, the reflector 120, the sacrificial layer 130, and the first protective layer 140.

Subsequently, the resistive layer 170 and the insulating layer 210 are patterned, and the result is shown in FIG. 2*b*. The patterning is performed such that the resistive layer 170 has no contact to the spacers 150*a* and 150*b*, and that additionally, the insulating layer 210 does not fully cover the resistive layer 170, so that a first contact point 175*a* and a second contact point 175*b* remain open.

As FIG. 2*c* shows, a contact layer 160 is applied thereon which establishes a contact between the resistive layer 170 and the spacers 150*a* and 150*b*.

Subsequently (as is shown in FIG. 2*d*), the contact layer 160 is initially patterned, which comprises, in particular, cutting through the contact layer 160 twice by columns 250*a* and 250*b*. As a result, the contact layer 160 is divided up into a layer 160*a*, which is in contact with the spacer 150*a* and with the resistive layer 170, a layer 160*b*, which is in contact with the spacer 150*b* and with the resistive layer 170, and a layer 160*c*, which is separate from the layer 160*a* and the layer 160*b*. Consequently, the layers 160*a* and 160*b* are separate, so that an electric current from the first spacer 150*a* to the second spacer 150*b* passes the resistive layer 170. In addition, the layer 160*c* is not in contact with the resistive layer 170 and has the task of adjusting a layer resistance of the membrane 10 in accordance with the characteristic impedance of an electromagnetic wave in air.

Subsequently, a second protective layer 180 is applied to the contact layer 160. The result is shown in FIG. 2*e*. Further patterning of the protective layer 180 defines a surface 192 of the membrane 10 of the bolometer.

In a next step, the columns 220*a* and 220*b* shown in FIG. 2*g* are created. The columns 220*a* and 220*b* cut through the membrane 10 comprising the first protective layer 140, the resistive layer 170, the insulating layer 210, the contact layer 160, and the second protective layer 180. Since a sectional plane belonging to the cross-sectional views 2*a* to 2*f* does not cross the columns 220*a* and 220*b*, the columns 220*a* and 220*b* are not shown in the cross-sectional views of FIGS. 2*a* to 2*f*. In the top view of FIG. 2*g*, the sectional plane is marked by the dashed line 230. The arrows 240 show the viewing direction of the sectional plane.

In a last step, shown in FIG. 2*f*, the first and second protective layers (140, 180) are patterned such that the surface 192 of the membrane 10 ends essentially flush with the spacers 150*a* and 150*b*, and eventually, the sacrificial layer 130 is removed.

In a further embodiment, patterning of the contact layer 160 is performed asymmetrically, i.e. the contact layer is separated only by a gap. In this embodiment, the steps leading up to the structure shown in FIG. 2*c* are identical to the previously described embodiment, and repetition of the description will be dispensed with at this point.

Figures 2H, 2I:
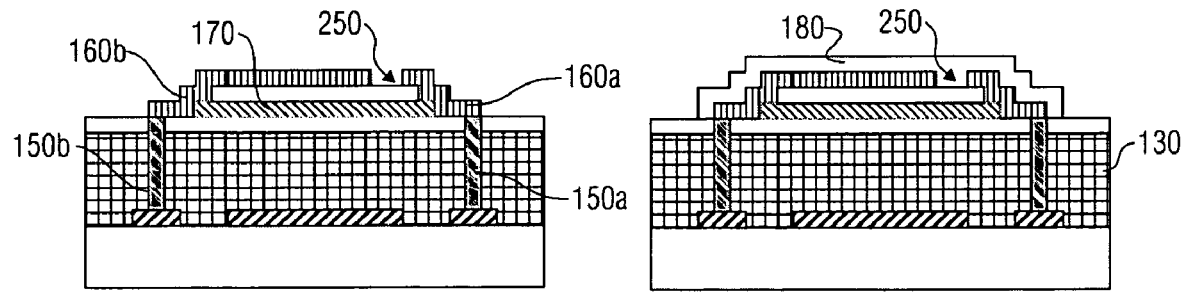

In this embodiment, the structure shown in FIG. 2c is patterned as shown in FIG. 2h, i.e., in particular, only a gap 250 is created which cuts through the contact layer 160. This results in a layer 160a which is in contact with the spacer 150a and to the resistive layer 170, a layer 160b which is in contact with the spacer 150b and with the resistive layer 170. Consequently, the layers 160a and 160b are separated in this case, too, so that an electric current from the first spacer 150a to the second spacer 150b passes the resistive layer 170. In this embodiment, the layer resistance of the membrane 10 may occur, in accordance with the characteristic impedance of an electromagnetic wave in air, by adapting, e.g., the layer 160b or the layer 160a.

Figure 2J:
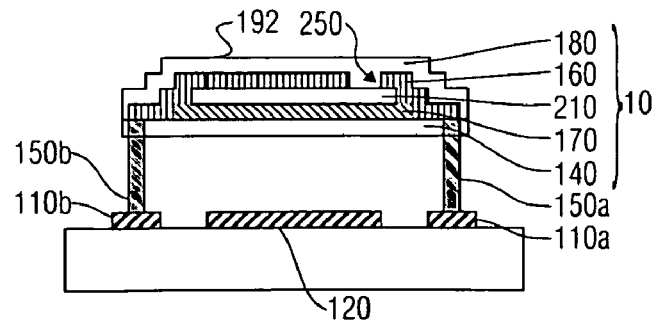

The steps (depositing the second protective layer 180, and patterning) shown in FIG. 2i again correspond to the steps described in FIG. 2e. The same applies to the other steps (creating the columns 220a and 220b, further patterning and removing the sacrificial layer 130), which were already described in the context of FIG. 2f. Therefore, renewed repetition will be dispensed with at this point. Finally, FIG. 2j shows the resulting bolometer comprising the membrane 10 and the asymmetric gap 250.

The indicated order of the steps is only an example and may be varied in further embodiments. For example, creating the columns 220a and 220b and/or forming the ridges 76a and 76b may also take place at the end. The columns 220a,b are implemented such that as large a region as possible of the resistive layer 170 is thermally insulated from the spacers 150a,b, and that, the fill factor thus is as large as possible. At the same time, however, they are to provide sufficient support for the membrane 10.

In addition to the process order discussed so far, a reversal is also feasible wherein the contact layer 160 is deposited prior to the resistive layer 170. This is shown in FIGS. 3a to 3g. Cross-sectional views are shown, again, wherein the first steps again correspond to a sequence of steps as was described in FIGS. 1a to 1c. A repetition of the explanations on the individual steps shall be omitted again at this point.

The structure shown in FIG. 3a corresponds to the structure shown in FIG. 1c, and comprises the first protective layer 140 as the top layer. In this embodiment, the contact layer 160 is deposited and patterned as the first further layer. The result is shown in FIG. 3b. The patterning is performed such that on the one hand, the contact layer 160 ends essentially flush with the spacers 150a and 150b, and on the other hand, it comprises a gap 250 which divides the contact layer 160 into the layer 160a and the layer 160b. The layer 160a is in contact with the spacer 150a, and the layer 160b is in contact with the spacer 150b.

As is shown in FIG. 3c, the insulating layer 210 is deposited thereon and patterned, so that the insulating layer essentially fills up the gap 250 and, in addition, leaves open the first contact point 175a at the layer 160a and the second contact point 175b at the layer 160b.

As is shown in FIG. 3d, the resistive layer 170 is deposited thereon and patterned, so that the resistive layer 170 ends essentially flush with the spacers 150a and 150b.

As is shown in FIG. 3e, the second protective layer 180 is again deposited thereon and patterned, so that the membrane 10 with the surface 192 is defined. The result is shown in FIG. 3f. As a last step, the sacrificial layer 130 is again removed, so that the structure of FIG. 3g results.

Figure 4A:
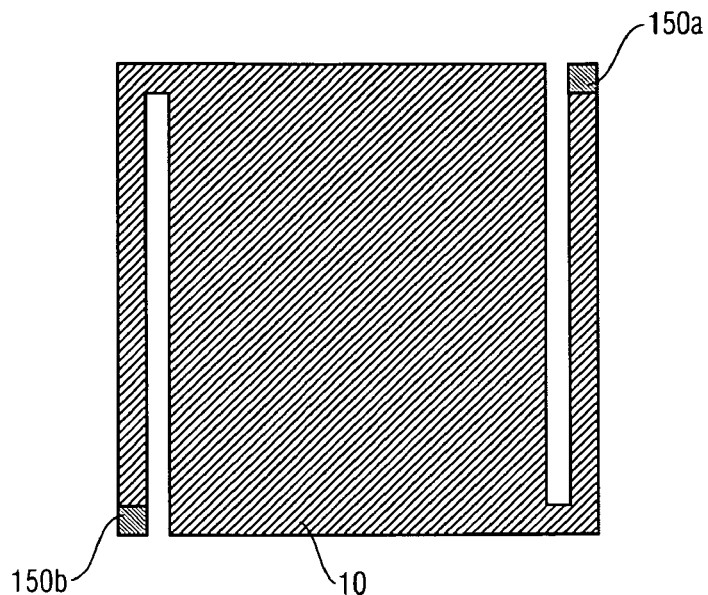
FIG. 4a shows a top view of a membrane comprising contact regions without any overlap.

FIG. 4a shows a top view of the membrane 10 comprising contact areas, where the spacers 150a and 150b contact the membrane 10.

Figure 4B:
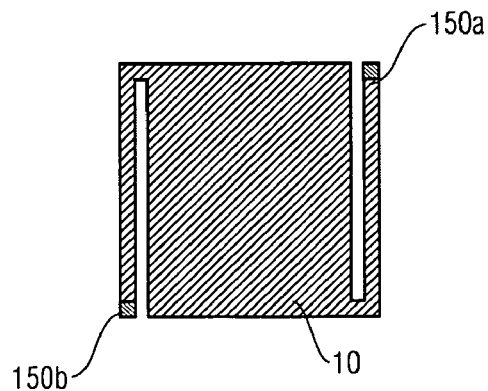
FIG. 4b shows a top view of a scaled membrane having contact regions without any overlap.

FIG. 4b shows the scaled membrane 10, i.e. a membrane 10 which is reduced in size accordingly. In this context, unlike the prior art, the contact areas 150a and 150b also scale in accordance with a size of the membrane 10. In both cases, the membrane 10 exhibits no overlap over contact areas at which the spacers 150a and 150b come into contact with the membrane 10.

Figure 4C:
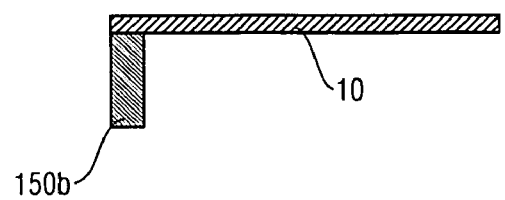
FIG. 4c shows a cross-sectional view of part of a membrane and a spacer.
Figure 7:
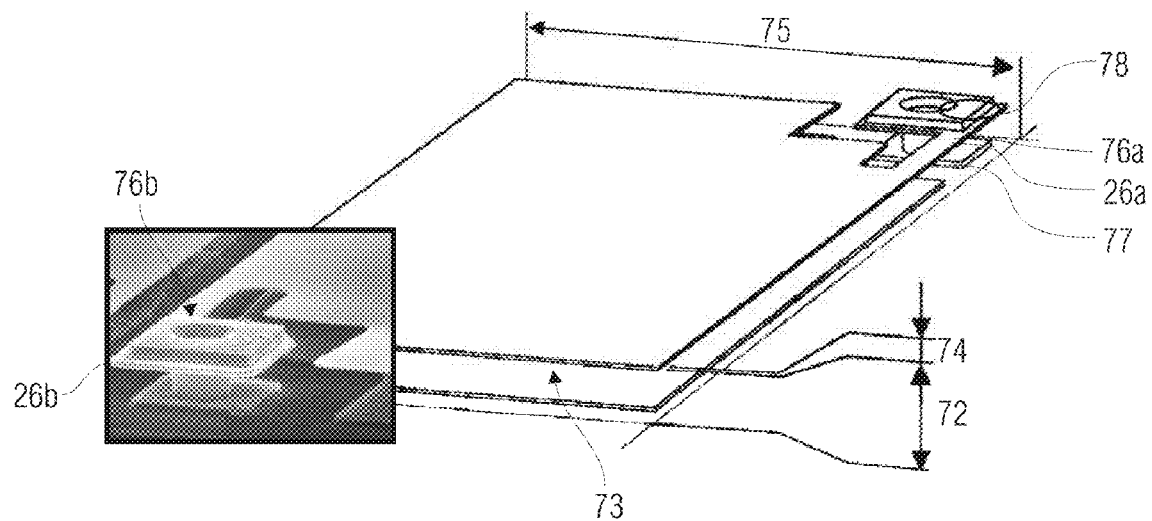
FIG. 7 shows a perspective view of a conventional structure comprising a membrane on two contact plugs with a metal overlap.
Figure 8A:
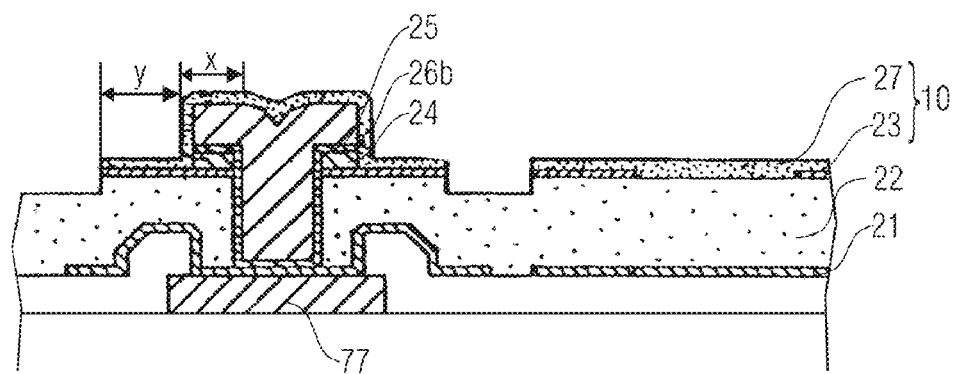
FIG. 8a shows a cross-sectional view of a conventional structure having a contact plug and a part of a membrane as well as remaining sacrificial layer.
Figure 8B:
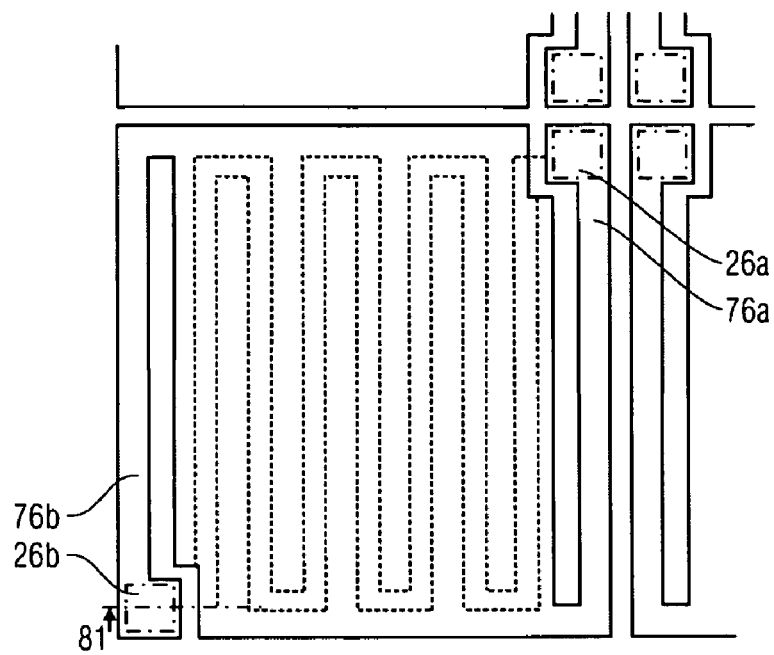
Figure 9:
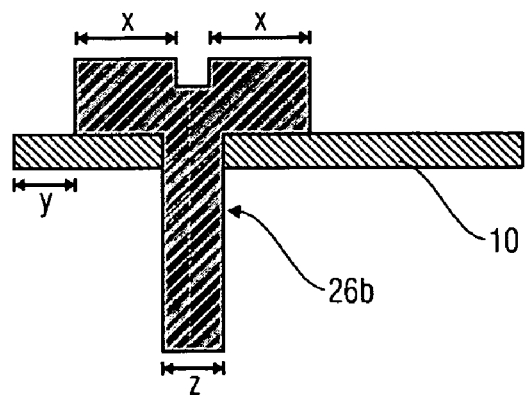
FIG. 9 shows a cross-sectional view of a contact plug and a part of a membrane and marked overlaps.
Figure 10A:
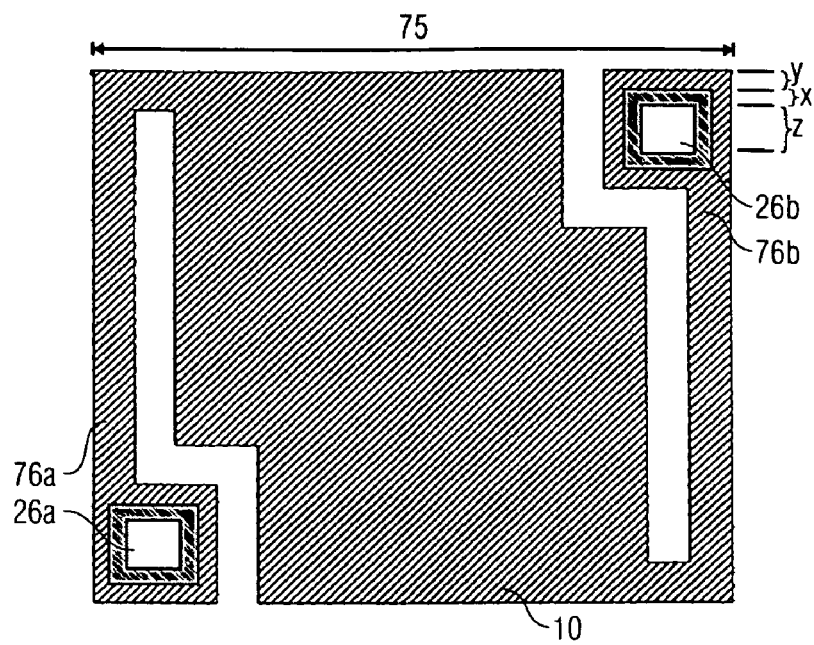
FIG. 10a shows a top view of a membrane comprising conventional contacting with contact plugs.
Figure 10B:
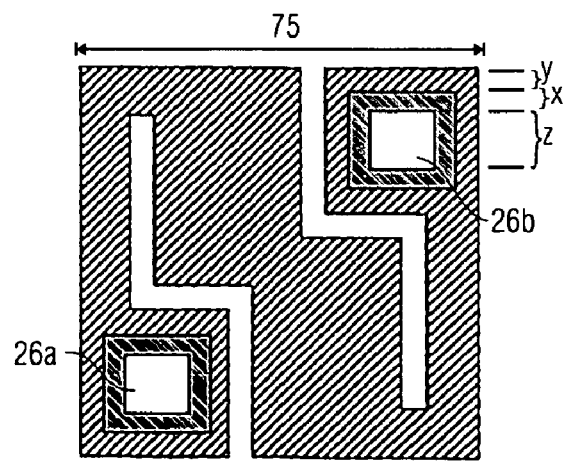
FIG. 10b shows a top view of a scaled membrane comprising conventional contacting with contact plugs.

FIG. 4c shows a scaled contact between the membrane 10 and the spacer 150b. The membrane 10 is positioned on the spacer 150b without any overlap.

As compared to the prior art, an inventive method is advantageous in several respects. For example, inventive processing using the spacers 150a and 150b, which advantageously comprise tungsten, and using the sacrificial layer 130, which advantageously comprises amorphous silicon (a-Si), enables reduction of the size of the IR-sensitive pixel. A conventional process using photosensitive polyimide has a minimum hole size which must be larger than approx. 3 µm. Even if smaller holes in the polyimide were possible (e.g. by means of a multilayer mask of photoresist and oxide on the polyimide, which may then be opened using an anisotropic etching process comprising oxygen plasma), said holes cannot be filled up, or may only be insufficiently filled up, with tungsten, for example. The tungsten deposition using the CVD method typically requires temperatures of more than 450° C., at which the polyimide is no longer stable.

On the other hand, utilization of a-Si as the sacrificial layer 130 is heat-resistant and enables depositing spacers 150a and 150b consisting of, e.g., tungsten, of a good quality, as are customary in CMOS technology for multi-layer metallization. For example, holes having very small diameters and high aspect ratios (depth/diameter) may be etched into the a-Si layer, as is known from the production of trenches in DRAMs. The a-Si layer is stable, so that a relatively intense etch-back process, e.g. using Ar ions, is possible prior to depositing the contact layer 160 (for example by sputtering Ti/TiN). This reduces a contact resistance between the spacers 150a,b and the contact layer 160, and improves the adhesion of the contact layer 160 to the spacers 150a,b.

The resulting structure having the membrane 10 resting on the spacers 150a,b may be scaled to have small dimensions, since the process steps mentioned (except for depositing and isotropically removing the exemplary a-Si sacrificial layer 130) may be gathered from any modern CMOS process. For example, a 0.25 µm process enables a diameter smaller than 0.5 µm for the spacers 150a,b, the support arms may be as wide as a diameter of the spacers 150a,b, and they may have a distance of 0.25 µm to the membrane 10.

Therefore, essential advantages of inventive processing are that the spacers 150a,b may be scaled to have clearly smaller dimensions while still exhibiting sufficient adhesion to the membrane 10. Consequently, moving the spacers 150a,b through the membrane 10, and an overlap by the values of x and y are not necessary as was the case with plugs 26a,b. In an embodiment of the present invention, formation of ridges 76a,b may further be dispensed with, which results in a further increase in the fill factor and in improved mechanical stability.

In addition, inventive processing enables the production of bolometers or bolometer arrays with clearly smaller pixel sizes at lower cost.

Thus, pixels of $20 \times 20$ µm$^2$ or $15 \times 15$ µm$^2$ with a constantly high fill factor are possible. The distance between the membranes 10 within a bolometer array may be 0.5 µm, for example, so that a pixel pitch (distance from the center of a pixel to the center of another pixel) may also be 15-20 µm.

As was set forth above, two embodiments of the present invention are based on two process flows. Both process flows may be summarized as follows while indicating advantageous materials, layer thicknesses, methods used, etc.

Process Flow A
- providing a CMOS disk with a passivated surface
- depositing a metallic reflector 120 and two terminal pads 110a, 110b for a connection CMOS membrane, e.g. made of thin Al (e.g. 100-200 nm, therefore only small stage)
- depositing a-Si approx. 2.5 μm (as a sacrificial layer 130)
- possibly smoothing the surface by a CMP process
- oxide deposition of a first protective layer 140 (approx. 200 nm)
- defining through openings 150a' and 150b' by means of photo technique (diameter approx. 0.5-1 μm)
- oxide-etching, silicon-etching anisotropically, stop on pad metal of terminal pads 110a and 110b
- Ti/TiN barrier sputtering in the through openings 150a' and 150b'
- tungsten CVD process for filling up the through openings 150a' and 150b'
- CMP method for removing the tungsten and Ti/TiN from the surface
- backsputtering
- sputtering the contact layer 160; TiN thin (for layer resistance of 377Ω/□)
- etching the contact layer 160 using photo technique (removing TiN underneath the actual resistor), forming a gap 162
- depositing a-Si, doped for bolometer resistor 170
- photo technique, etching a-Si, patterning the resistive layer 170
- depositing oxide using a CVD process in order to form the second protective layer 180 (approx. 30 nm)
- photo technique for defining the membrane area, and baring the terminal arms
- etching the layers as far as into the a-Si sacrificial layer
- removing the a-Si sacrificial layer 130, for example using highly selective oxide (is hardly attacked), isotropic etching in gaseous XeF$_2$.

Process Flow B
- providing a CMOS disk with a passivated surface
- depositing a metallic reflector 120 and two terminal pads 110a and 110b for a connection CMOS membrane, e.g. made of thin Al (e.g. 100-200 nm, therefore only small stage)
- depositing a-Si approx. 2.5 μm (as a sacrificial layer 130)
- possibly smoothing the surface by a CMP process
- oxide deposition of a first protective layer 140 (approx. 200 nm)
- defining through openings 150a' and 150b' by means of photo technique (diameter approx. 0.5-1 μm)
- oxide-etching, silicon-etching anisotropically, stop on pad metal of terminal pads 110a and 110b
- Ti/TiN barrier sputtering in the through openings 150a' and 150b'
- tungsten CVD process for filling up the through openings 150a' and 150b'
- CMP for removing the tungsten and Ti/TiN from the surface
- backsputtering
- depositing a-Si, doped for bolometer resistance 170
- depositing oxide using a CVD process in order to form the insulating layer 210 (approx. 30 nm)
- photo technique for patterning the oxide of the insulating layer 210
- photo technique for patterning the bolometer resistance 170
- sputtering the contact layer 160; TiN thin (for layer resistance of 377Ω/□)
- depositing oxide using a CVD process as the second protective layer 180 (approx. 30 nm)
- photo technique for defining the narrow ridge regions 76a and 76b, etching oxide (second protective layer 180), TiN (contact layer 160), a-Si (resistive layer 170), and again oxide (first protective layer 140).
- photo technique for insulating the TiN layer 160 of the membrane 10
- etching oxide of the second protective layer 180 and TiN of the contact layer 160, and creating the columns 250a and 250b
- depositing oxide using a CVD process for protecting the contact layer 160 (approx. 30 nm)
- removing the a-Si sacrificial layer 130, for example using highly selective oxide (is hardly attacked), isotropic etching in gaseous XeF$_2$.

The materials indicated above are only examples which allow very good processing. Some alternatives include the following replacements, for example.

The sacrificial layer 130 of a-Si may alternatively be etched using ClF$_3$ (chlorofluoride) or using an isotropic SF$_6$ plasma (sulfuric fluoride plasma). The sacrificial layer 130 may also comprise a heat-resistant polymer (e.g. polyimide). The through openings 150a' and 150b' for the spacers 150a and 150b may then be etched with anisotropic O$_2$ plasma, the sacrificial layer 130 may also be removed using an O$_2$ plasma.

When the sacrificial layer 130 is removed in an etching step, it is important to protect the resistive layer 170 and/or the contact layer 160 during the etching step. To this end, the presence of the protective layer 140 is advantageous. The material is advantageously selected such that it is not or hardly attacked in the step of removing the sacrificial layer 130. However, if there is a method available which removes the sacrificial layer 130 without attacking the resistive layer 170 and/or the contact layer 160, the first protective layer 140 may also be dispensed with in a further embodiment.

The temperature-dependent resistive layer 170 may comprise, for example, a different semiconductor material (VO$_x$, GaAs, organic semiconductor, or others). Instead of the silicon oxide layers, it is also possible to use layers of silicon nitride (or a combination of both).

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A bolometer comprising:
   a membrane;
   a first spacer;
   a second spacer,
   the membrane comprising a resistive layer, a first protective layer, a second protective layer, and a contact layer, the resistive layer and the contact layer extending between the first protective layer and the second protective layer with the first protective layer being located at a side of the membrane facing a foundation, the first protective layer including a first through hole and a second through hole, the contact layer comprising, at a side facing the foundation, a first contact region at which the first spacer extends through the first through hole in the first protective layer and electrically contacts the contact layer, and a second contact region at which the second spacer extends through the second through hole in the first protective layer and electrically contacts the contact layer, and the first and second spacers keeping the membrane at a predetermined distance from the foundation, the contact layer being laterally interrupted by a gap, so that the contact layer is subdivided at least into two parts, the first part of which comprises the first contact region, and the second part of which comprises the second contact region, and no direct connection existing within the contact layer from the first contact region to the second contact region, and the resistive layer being in contact with the first part of the contact layer and with the second part of the contact layer, wherein the membrane is patterned so that a first ridge and a second ridge for thermal insulation are provided in the membrane, the first ridge includes the first contact region in contact with the first spacer, and the second ridge includes the second contact region in contact with the second spacer.

2. The bolometer as claimed in claim 1, wherein lateral ends of the membrane are substantially flush with the first spacer and the second spacer.

3. The bolometer as claimed in claim 1, wherein the predetermined distance equals a quarter of an infrared wavelength.

4. The bolometer as claimed in claim 1, wherein the contact layer comprises a layer thickness so that a layer resistance of the membrane corresponds to a characteristic impedance of electromagnetic waves in air.

5. The bolometer as claimed in claim 1, wherein the foundation comprises a reflector.

6. The bolometer as claimed in claim 1, wherein the membrane comprises, in a top view of a side facing away from the foundation, a substantially square shape, and wherein the first spacer and the second spacer are located at opposing corner points of the membrane.

7. The bolometer as claimed in claim 1, wherein the gap comprises a width such that a resistance contribution to a measuring resistor of the bolometer, which is due to a current flowing between the first contact region and the second contact region, ranges approximately between 1 k$\Omega$ and 100 M$\Omega$.

8. The bolometer as claimed in claim 1, wherein a position of the gap is selected such that an electric current from the first spacer to the second spacer reaches the gap after having covered a certain distance, and wherein the distance covered is equal to a distance, as far as possible, covered by the electric current on its way from the gap to the second spacer.

9. The bolometer as claimed in claim 1, wherein the membrane further comprises an insulating layer arranged between the resistive layer and the contact layer, and wherein the resistive layer is located on the side of the membrane which faces the foundation.

10. The bolometer as claimed in claim 1, wherein the membrane further comprises an insulating layer arranged between the contact layer and the resistive layer, and wherein the contact layer is located on the side of the membrane which faces the foundation.

11. The bolometer as claimed in claim 1, wherein the resistive layer comprises amorphous silicon or vanadium oxide.

12. The bolometer as claimed in claim 1, wherein the contact layer comprises titanium nitride.

13. The bolometer as claimed in claim 1, wherein the first spacer and/or the second spacer comprise tungsten or copper.

14. The bolometer as claimed in claim 1, wherein the foundation further comprises a first terminal pad and a second terminal pad arranged to contact the first spacer and the second spacer, respectively.

15. A method of producing a bolometer, comprising the steps of:
  a) providing a substrate;
  b) depositing a sacrificial layer onto the substrate;
  c) depositing a first protective layer on the sacrificial layer;
  d) forming a first through opening and a second through opening through the sacrificial layer and the first protective layer so as to extend to the substrate;
  e) forming first and second spacers in the first and second through openings;
  f) applying a contact layer such that the contact layer comprises, at a side facing the substrate, a first contact region at which same is contacted by the first spacer, and a second contact region at which same is contacted by the second spacer;
  g) patterning the contact layer so as to form a gap within same, so that the contact layer is subdivided into two parts, the first part of which comprises the first contact region, and the second part of which comprises the second contact region, and no direct connection existing within the contact layer from the first contact region to the second contact region;
  h) applying a resistive layer such that the resistive layer is in contact with the first part of the contact layer and with the second part of the contact layer, the resistive layer and the contact layer forming a membrane of the bolometer;
  i) depositing a second protective layer;
  j) patterning an outline of the membrane; and
  k) patterning the membrane in order to form within same a first ridge and a second ridge for thermal insulation, the first ridge being in contact with the first spacer, and the second ridge being in contact with the second spacer;
  l) removing the sacrificial layer.

16. The method as claimed in claim 15, wherein a sequence of the steps is defined by the steps of depositing the sacrificial layer onto the substrate, applying the contact layer, patterning the contact layer, applying the resistive layer, and patterning the outline of the membrane.

17. The method as claimed in claim 15, further comprising a step of depositing a reflector between the steps of providing the substrate and depositing the sacrificial layer.

18. The method as claimed in claim 15, further comprising, between the steps of patterning the contact layer and applying the resistive layer, a step of applying an insulating layer such that the insulating layer leaves open the first part at a first contact point and the second part at a second contact point.

19. The method as claimed in claim 15, wherein the step of applying the sacrificial layer is performed such that the sacrificial layer comprises a layer thickness which corresponds to a quarter of an infrared wavelength.

20. The method as claimed in claim 15, wherein the step of applying the contact layer is performed such that the contact layer comprises a layer thickness such that the sheet resistance of the membrane corresponds to a characteristic impedance of an electromagnetic wave in air.

21. The method as claimed in claim 15, wherein the step of providing the substrate comprises the steps of:
  a1) providing the substrate; and a2) forming a first terminal pad and a second terminal pad on the substrate, the first terminal pad contacting the first spacer, and the second terminal pad contacting the second spacer.

22. The method as claimed in claim 15, wherein the step of applying the resistive layer comprises using amorphous silicon oxide or vanadium oxide.

23. The method as claimed in claim 15, wherein the step of applying the contact layer comprises using titanium nitride, and the step of forming the first and second spacers comprises using tungsten or copper.

24. The method as claimed in claim 15, wherein the step of depositing the sacrificial layer comprises chemical vapor deposition.

25. The method as claimed in claim 15, wherein the step of depositing the first protective layer and the step of depositing the second protective layer are performed such that the first and second protective layers comprise oxide, the step of applying the sacrificial layer is performed such that the sacrificial layer comprises amorph silicon, and the step of removing the sacrificial layer comprises selective isotropic etching the sacrificial layer.

26. A method of producing a bolometer, comprising the steps of:
   a) providing a substrate;
   b) depositing a sacrificial layer onto the substrate;
   c) depositing a first protective layer on the sacrificial layer;
   d) forming a first through opening and a second through opening through the sacrificial layer and the first protective layer so as to extend to the substrate;
   e) forming a first spacer within the first through opening and a second spacer within the second through opening;
   f) laterally applying a resistive layer such that the resistive layer is not in contact with conductive material within the first and second through openings;
   g) applying an insulating layer on a side of the resistive layer which faces away from the substrate, so that the insulating layer leaves the resistive layer open at a first contact point and at a second contact point;
   h) applying a contact layer such that the contact layer comprises, at a side facing the substrate, a first contact region at which same is contacted by the first spacer, and a second contact region at which same is contacted by the second spacer, and such that the contact layer is in contact with the first contact point and with the second contact point of the resistive layer;
   i) patterning an outline of the membrane;
   j) patterning the membrane in order to form within same a first ridge and a second ridge for thermal insulation, the first ridge being in contact with the first spacer, and the second ridge being in contact with the second spacer;
   k) patterning the contact layer in order to form at least one gap within same, so that the contact layer is subdivided into at least two parts, the first part of which comprises the first contact region and the first contact point of the resistive layer, and the second part of which comprises the second contact region and the second contact point of the resistive layer, and no direct connection existing within the contact layer from the first contact region to the second contact region;
   l) depositing a second protective layer; and
   m) removing the sacrificial layer.

27. The method as claimed in claim 26, wherein a sequence of steps is defined by the steps of forming the first spacer, laterally applying the resistive layer, applying the insulating layer, applying the contact layer, patterning the outline of the membrane, and patterning the membrane.

28. The method as claimed in claim 26, further comprising, between the steps of providing the substrate and depositing the sacrificial layer:
   depositing a reflector;
   forming a first terminal pad and a second terminal pad on the substrate; and
   the first terminal pad contacting the first spacer, and the second terminal pad contacting the second spacer.

29. The method as claimed in claim 26, wherein the step of depositing the sacrificial layer is performed such that the sacrificial layer comprises a layer thickness which corresponds to a quarter of an infrared wavelength.

30. The method as claimed in claim 26, wherein the step of depositing the first protective layer being performed between the steps of depositing the sacrificial layer and forming the first through opening and a second through opening, and the step of depositing the second protective layer being performed between the steps of patterning the contact layer and removing the sacrificial layer.

31. The method as claimed in claim 26, wherein the step of patterning the contact layer comprises the step of forming a second gap, so that the contact layer further comprises a third part, and wherein the step of applying the contact layer is performed such that the third part comprises a layer thickness such that a sheet resistance of the membrane corresponds to a characteristic impedance of an electromagnetic wave in air.

32. The method as claimed in claim 26, wherein the step of depositing the first protective layer and the step of depositing the second protective layer are performed such that the first and second protective layers comprise oxide, the step of applying the sacrificial layer is performed such that the sacrificial layer comprises amorph silicon, and the step of removing the sacrificial layer comprises selective isotropic etching the sacrificial layer.

* * * * *